March 19, 1963

H. F. RIETH 3,082,393

TELEVISION TUNER

Filed May 27, 1960

2 Sheets-Sheet 1

INVENTOR:
Harold F. Rieth
By Smyth, Roston & Pavitt
Attorneys.

INVENTOR:
Harold F. Rieth
By Smyth, Roston & Pavitt
Attorneys.

United States Patent Office 3,082,393

Patented Mar. 19, 1963

3,082,393

TELEVISION TUNER

Harold F. Rieth, Pasadena, Calif., assignor to Packard-Bell Electronics Corporation, Los Angeles, Calif., a corporation of California Filed May 27, 1960, Ser. No. 32,459
12 Claims. (Cl. 338—172)

This invention relates to television receivers and, more particularly, to tuners utilized in television receivers.

Conventional television receivers include a tuner with two tuning controls; a channel selector; and a fine tuner control. The channel selector adjusts the tuner in a stepwise manner to any one of the television channels in order to selectively receive the television carrier for that channel. After a channel has been selected, the fine tuner control is adjusted to more accurately tune the selected channel. The fine tuning setting may be different for each channel so that whenever the channel is changed by the channel selector, the fine tuning setting is thereafter also changed.

Many people and especially children do not understand the fine tuning adjustment, and for those more sophisticated with respect to this adjustment, the necessity of the fine tuning is a nuisance. Further, with the development of wireless remote control units for television receivers, the viewer may change the channel from the remote location but the fine tuning adjustment is still generally made at the receiver. The fine tuning adjustment is at the receiver in order to provide for relatively simple and economical remote control units. In addition to the fine tuning adjustment, adjustments for contrast, volume and brightness may be different for each channel and, accordingly, present similar difficulties and annoyances relating to the necessity of making adjustments after each channel selection.

In a specific illustrative embodiment of this invention, a television tuner is provided having a separate fine tuning control for each channel and means for selectively providing access to the fine tuning controls in accordance with the channel selection. A channel selector knob fits over and is concentric with a fine tuning assembly which includes the separate fine tuning controls. The channel selector knob has an opening which selectively permits access to the fine tuning controls in accordance with the position of the channel selector knob.

The fine tuning assembly is mounted on the front of the television tuner and the channel selector shaft, which passes through the fine tuning assembly, supports a rotary contact member of switching means in the assembly. The switching means selectively connects one of a number of adjustable impedance means associated individually with the fine tuning controls to the tuner circuitry to automatically change the fine tuning when the channel is changed.

Features of this invention pertain to the provision of adjustable impedance means in the form of printed circuitry and a resilient contact engaging the circuitry. The resilient contact is mounted on the fine tuning control and accordingly rotatable therewith. The printed circuitry for the different channels are connected to different terminals of the switching means control by the channel selector shaft. The position of the fine tuning control for each channel, accordingly, determines the impedance coupled through the switching means to the tuner circuitry when the channel is selected.

Further advantages and features of this invention will become apparent upon consideration of the following description when read in conjunction with the drawing wherein.

Figures 1, 2:
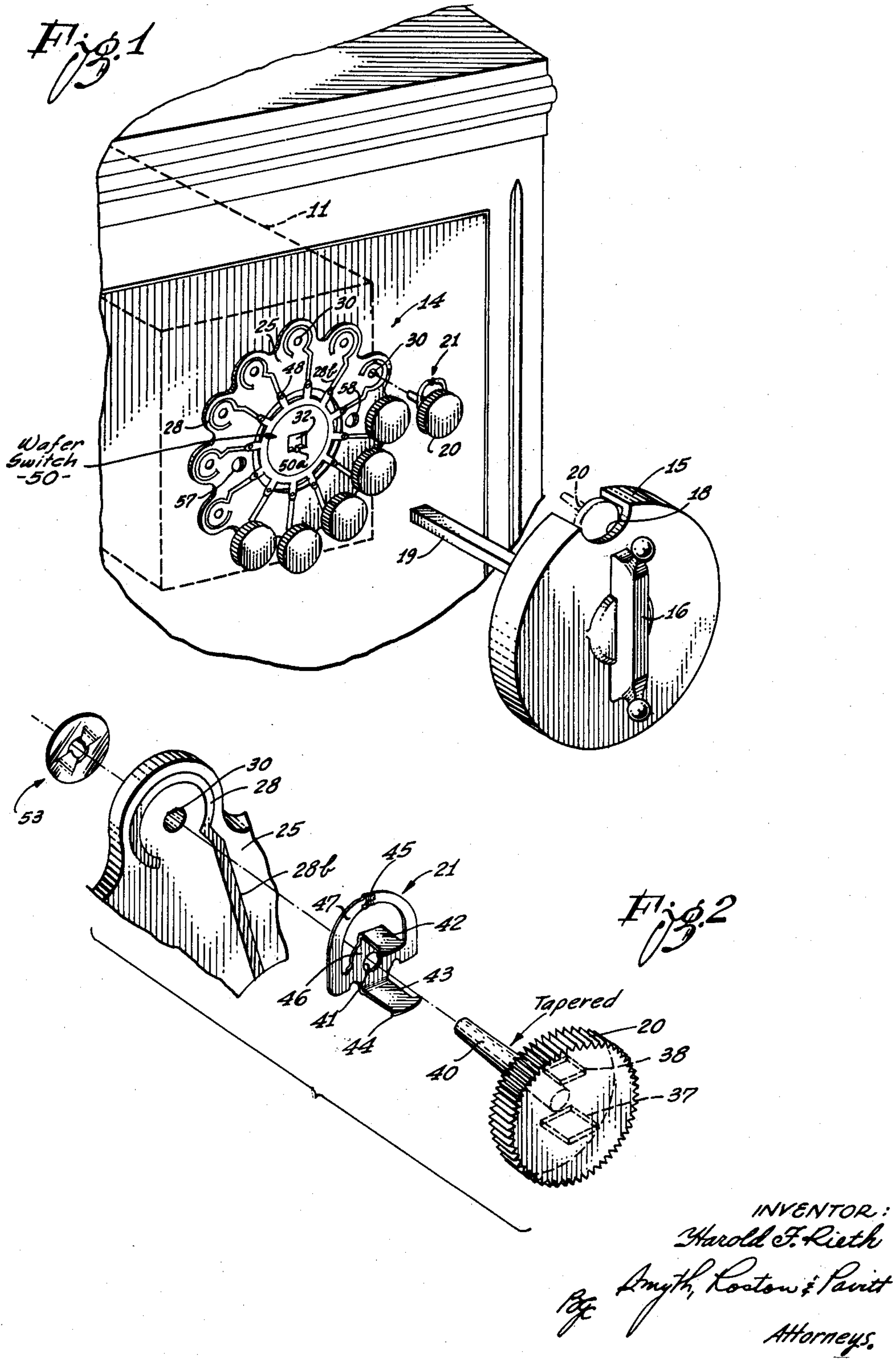
FIGURE 1 is an exploded pictorial view of part of the tuning control assembly of this invention illustrating the relationship between the selector and fine tuning control knobs.
FIGURE 2 is an exploded view of part of the fine tuning assembly of this invention illustrating the adjustable impedance means.
Figure 3:
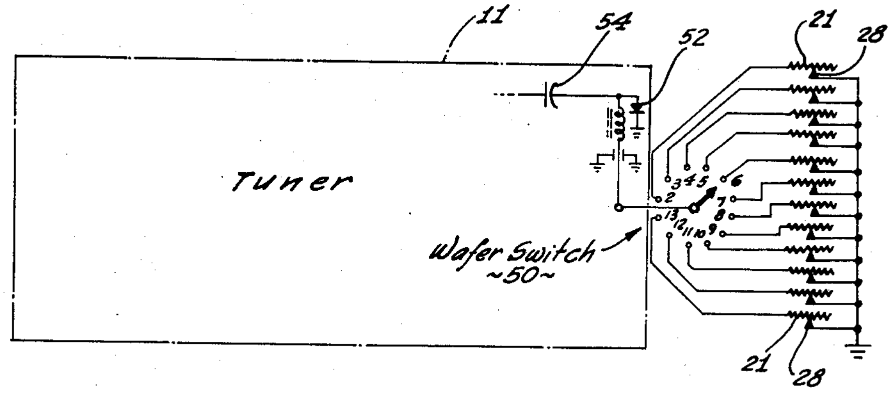
FIGURE 3 is a circuit representation of the fine tuning assembly of this invention.

Referring to FIGURES 1 through 3, a television receiver 10 is provided having a tuner 11 shown in phantom in FIGURES 1 and 3 which may be conventional. Illustratively, the tuner may be of the type in which different sets of inductors, not shown, are selectively connected in accordance with the channel selection. Such tuners are exemplified by the tuners manufactured by the Standard Coil Products Company and one such tuner is designated GG 4303.

A fine tuning assembly 14 is mounted on the front of the chassis of the tuner 11 by means of fasteners 57 and 58 which may be screws. The fine tuning assembly 14 includes a printed circuit board 25 and one control knob 20 for each of the 12 channels provided in conventional television receivers. A channel selector knob 15 is mounted over the fine tuning assembly 14 and has a shaft 19 which passes through the fine tuning assembly 14 to the tuner 11. The knob 15 includes a protrusion 16 to facilitate the stepwise rotation of the knob 15. When the knob 15 is rotated, it changes the channel setting of the tuner 11 for the reception of a different carrier at the television receiver 10. The shaft 19, as illustrated in FIGURE 1, has a substantially rectangular shape to facilitate the rotation of a rotary or wafer switch 50 as well as components, not shown, in the tuner 11. The switch 50 is part of the fine tuning assembly 14 and is mounted concentric with the printed board 25. The shaft 19 passes through an opening 32 in the switch 50, and may include at its lower surface a longitudinal ridge, not shown, which mates with an indentation or groove 50*a* of the rotary switch 50.

The wafer switch 50 functions to selectively connect one of twelve rheostats each of which includes a printed resistor member 28 and a small contact member 21 mounted on the back of an associated control knob 20. The control knob 20 supports the contact member 21 in a position to resiliently engage the printed circuit member 28 on the printed board 25. The contact member 21 includes two flanges 42 and 43 which fit into openings 38 and 37 respectively in the back of the knob 20. The flanges 42 and 43 are forced into the openings 38 and 39 and retained thereby two prongs 44 at each of their ends. A central portion 46 of the contact member 21 defines a circular opening 41 through which the shaft 40 of the fine tuning knob is inserted. A pair of arcuate arms 47 extend on either side from the central portion 46 and are welded together to form a slight protrusion 45. The protrusion 45 extends towards the printed board 25 and serves as the contact point of the member 21 to engage the printed resistor member 28 on the board 25. The arms 47 are resilient so that the contact member 21 resiliently engages the printed resistor 28.

As the control knob 20 is rotated, it rotates the contact member 21 to cause the protrusion or contact 45 to ride along the arcuate portion of the printed resistor member 28. A shaft 40 of the control knob 20 is tapered slightly to limit the entry of the shaft 40 through an opening 30 at the center of the circle formed through the arcuate portion of the printed resistor member 28. The limited entry of the shaft 40 in this manner provides for a predetermined spacing between the control knob 20 and the printed board 25. The spacing is such as to provide for a slight flexing of the resilient arms 47 of the contact member 21 to insure that contact is maintained even if the shaft 40 is slightly misaligned with respect to the board 25.

The shaft 40, the contact member 21 and a fastener 53, which engages the shaft 40 at the back of the board 25, may all be made of electrically conductive material. The knob 20, except for the shaft 40, may be made of an insulating material such as a plastic. The back of the board 25 forms a printed common or ground connection for the fine tuning assembly 14. An electrical connection is provided from this ground connection through the fastener 53, the shaft 40, the contact member 21 and the printed resistor member 28 to the wafer switch 50. Each of the twelve printed resistor members 28 includes a radial portion 28*b* which is electrically connected to an individually associated terminal of the wafer switch 50.

As shown particularly in FIGURE 3, the ground connection is extended through the rheostats formed by the printed resistor members 28 and their associated contact members 21 to the twelve terminals of the wafer switch 50. The wafer switch 50 selectively extends the grounded resistor connection to a fine tuning circuit including an inductor 53 and a capacitor 54. The junction between the inductor 53 and the capactior 54 is coupled by a diode 52 to ground. The capacitor 54 and inductor 53 may be part of the conventional fine tuning circuitry in the tuner 11. The conventional rheostat in series with the inductor 53, however, is replaced by the fine tuning assembly 14. The fine tuner circuitry including the inductor 53 and the capacitor 54 are common to all twelve channels but different magnitudes of resistances are coupled to the inductor 53 in accordance with the different settings of the fine tuning control knobs 20.

The channel selector knob 15 in FIGURE 1 defines a peripheral arcuate opening 18 which permits access to one of the twelve fine tuning knobs 20 in accordance with the position of the channel selector knob 15. The channel selector knob 15 is rotatable over the fine tuning knobs 20 which are stationary with respect thereto in that they do not rotate about the longitudinal axis of the channel selector knob 15. If the selector knob 15 is set to select channel 2, for example, the fine tuning knob 20 associated with channel 2 is visible and accessible through the opening 18 of the knob 15. The control knob 20 for channel 2 may accordingly be rotated to adjust the resistance introduced through the wafer switch 50 to the fine tuning circuitry in the tuner 11 in order to provide for a sharp and clear picture on the face of the picture tube, not shown.

Each of the channels may be successively adjusted in this manner with the fine tuning adjustment being retained for each by the position of the different fine tuning knobs 20. Thereafter, when a channel is selected or changed by the channel selector knob 15, the fine tuning adjustment for that particular channel is automatically made therewith by the switching operation of the wafer switch 50 which is rotated with the channel selector shaft 19. Further, if a remote control unit, not shown, is utilized for the channel selection, it need not include a fine tuning control. Periodically, perhaps once or twice a year, the twelve fine tuning knobs 20 may be set to compensate for any drift due to component aging. There can be no confusion as to which of the fine tuning knobs 20 should be adjusted to fine tune a particular channel because only the particular knob 20 for the selected channel is accessible for manual rotation.

Figure 4:
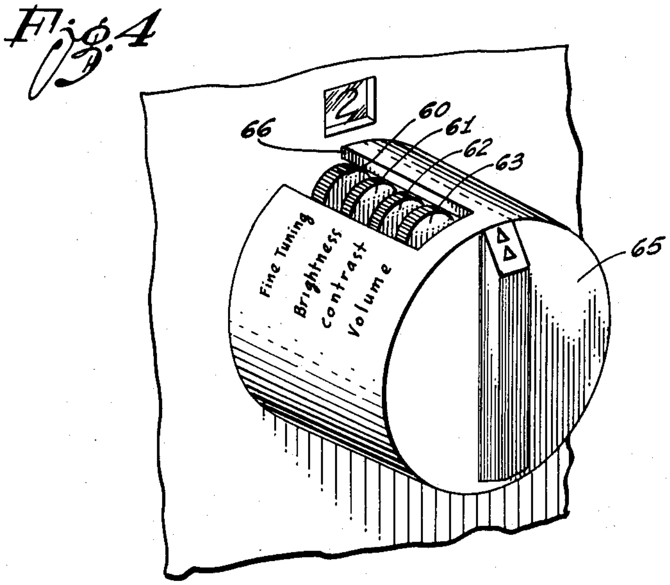
FIGURE 4 is a pictorial view of a modification of the tuning assembly of this invention including individual channel controls for fine tuning, brightness, contrast and volume.

In addition to the fine tuning adjustment, adjustments for contrast, brightness and volume may be preset for the different channels. These characteristics may be different for the different channels and in conventional receivers adjustments may be required after each channel selection. In FIGURE 4, a modification of the tuning assembly of this invention is shown in which four separate control assemblies 60, 61, 62 and 63 are provided. Each of the four control assemblies 60 through 63 includes twelve different control knobs, one for each station.

Each of the assemblies 60 through 63 is essentially similar to the assembly 14 described above and the stacked arrangement of these four assemblies is covered by a hollow channel selector knob 65. The selector knob 65 defines a slotted opening 66 which provides access to one of the control knobs in each of the four assemblies 60 thorugh 63. These four accessible control knobs may be adjusted for the particular channel in order to preset the fine tuning, brightness, contrast and volume adjustments for the selected channel. Each of the twelve channels may have these four controls preset in this manner. Thereafter, when a channel is selected by rotating the control knob 65, all four adjustments are automatically made by the four wafer switches not shown of the four assemblies 60 through 63.

The four control assemblies 60 through 63 are of progressively smaller diameters so that the control knobs in the four assemblies are at different radial distances and, therefore, more readily distinguishable. The control knob 65 is tapered toward the front so that the opening 66 slants inward towards the front of the knob 65. In this manner, only a single adjustment is required by the viewer either at the television receiver or at a remote position when a remote control unit is utilized for changing the channel and for automatically making all control adjustment for the selected channel.

Although this invention has been disclosed and illustrated with reference to particular applications, the principles involved are susceptible of numerous other applications which will be apparent to persons skilled in the art. The invention is, therefore, to be limited only as indicated by the scope of the appended claims.

I claim:

1. A control assembly for a television tuner, including, a variable impedance element for each channel of television reception, a manual control for each variable impedance element for adjusting the variable impedance element, means including a channel selector control for selectively permitting manual access to the manual controls in accordance with the channel selection whereby only the variable impedance element of the selected channel can be adjusted, each of said variable impedance members including a printed circuit resistor having an arcuate shape, and a rotatable contact member for electrically contacting said resistor, said contact member being supported on the associated one of the manual controls for said variable impedance member, said control knob including a shaft made of electrically conductive material, and a fastener made of electrically conductive material for rotatably supporting said shaft so that said contact is against said resistor and also for establishing an electrically conductive path from said fastener through said shaft and through said contact member to said resistor.

2. A tuner control assembly for a television receiver having a plurality of channels, including, a plurality of rotatable manual control knobs disposed at the front of the television receiver in an annular relationship for manual operation and for controlling the production of an image by the television receiver in accordance with such manual operation, a rotatable manual control knob for each channel on the side of said panel adjacent its front for controlling the fine tuning adjustment for the channel, a plurality of variable impedance members each associated with a different one of the knobs and each adjustable by the control knob for the associated channel, a rotatable channel selector knob disposed at the front of the television receiver for manual operation and covering the control knobs and defining an opening for permitting access to a selected one of said control knobs in accordance with the position of the channel selector knob, and switching means mechanically coupled to said channel selector knob for selectively establishing an electrical connection to said variable impedance members in accordance with the position of said channel selector knob.

3. A tuner control assembly in accordance with claim 2 wherein each of said variable impedance members includes a printed circuit resistor having an arcuate shape, and a rotatable contact member for electrically contacting said resistor, said contact member being supported on the associated one of the control knobs which adjusts said variable impedance member.

4. A control assembly for a television tuner in a television receiver having a plurality of channels, including, a plurality of variable impedance elements each controlling the characteristics of the image visually presented by the television receiver for a different one of the channels in the receiver, a plurality of manual controls each operatively coupled to a different one of the variable impedance elements for adjusting the variable impedance element and each disposed at the front of the television receiver for manual operation, and means including a channel selector control disposed in front of the manual controls and provided with a configuration for selectively permitting direct manual access to the manual controls in the plurality in accordance with the channel selection whereby only the variable impedance element of the selected channel can be adjusted.

5. A turner control assembly for a television receiver having a plurality of channels, including, a plurality of control knobs disposed at the front end of the television receiver for manual operation and disposed in annularly spaced relationship, a plurality of variable impedance members each controlled by the control knob for a different channel in the plurality and each operative to vary the characteristics of the image visually presented for that channel, a channel selector control for selecting one of the channels for reception of the television receiver, the channel selector control being disposed in front of the control knobs to cover the control knobs and being provided with a configuration to expose successive ones of the control knobs for manual operation upon a rotation of the channel selector control, and switching means mechanically coupled to said channel selector for selectively establishing an electrical connection to said variable impedance members in accordance with the position of said channel selector.

6. A control assembly for a television tuner in a television receiver having a plurality of different channels, including, a plurality of variable impedance elements each operative to vary the characteristics of the image visually presented to a different channel in accordance with variations in the impedance presented by the element, a plurality of manual controls disposed in annularly spaced relationship at the front of the television receiver and each operatively coupled to a different one of the impedance elements in the plurality and manually adjustable to vary the impedance of the coupled element, and means including a channel selector control disposed at the front of the television receiver in front of the manual controls and manually rotatable and having an opening to provide manual access to the manual controls in accordance with the manual rotation of the channel selector control whereby only the variable impedance element of the selected channel can be adjusted, each of said variable impedance elements including a printed circuit resistor having an arcuate shape, and a rotatable contact member electrically contacting said resistor, said contact member being supported on the associated one of the manual controls for said variable impedance element to vary the impedance of said element in accordance with rotation of the associated manual control.

7. A control assembly for a television tuner in a television receiver having a plurality of channels, including, a plurality of variable impedance elements each connected to vary the characteristics of the image presented by the television receiver in a different channel of the television receiver, a plurality of manual controls disposed in annularly spaced relationship at the front of the television receiver and each operatively coupled to a different one of the impedance elements in the plurality for varying the impedance of the associated element in accordance with the manual operation of the control, a channel selector control disposed at the front of the television receiver and manually rotatable to select individual channels in the plurality and provided with a configuration to cover the manual controls and provided with an opening to expose successive ones of the manual controls upon a rotation of the channel selector control and disposed in front of the manual controls and manually rotatable to select the different channels and provided with a configuration for covering the manual controls and provided with an opening for exposing the different manual controls in the plurality in accordance with the rotary disposition of the channel selector, and a selector switch mechanically coupled to the channel selector control for selectively establishing an electrical connection to individual ones of said impedance elements in accordance with the channel selection by said channel selector control.

8. A control assembly for a television tuner in a television receiver having a plurality of channels, including, a plurality of manual controls disposed at the front of the receiver in an aligned relationship for each channel for effecting different adjustments of the receiver tuner to control the characteristics of the images visually presented by that channel, a channel selector for selecting the channel to be received and disposed in front of the manual control and provided with a configuration to cover the manual controls and to expose successive ones of the manual controls for manual operation upon a progressive positioning of the channel selector, a plurality of impedance elements each connected to a different one of the manual controls in the plurality to control different characteristics of the visual image for the particular channel in accordance with the adjustments of the controls, and channel selector control means mechanically coupled to said selector for obtaining an energizing of the impedance element associated with the channel selected by said channel selector.

9. A control assembly for a television tuner in a television receiver having a plurality of channels, including, a plurality of manual controls disposed in groups for each channel and disposed at the front of the television receiver in an axially aligned relationship for the controls in each group and in an annularly spaced relationship for the controls in the different groups for effecting different adjustments controlling the characteristics of the image visually presented by the receiver for that channel, a channel selector for selecting the channel to be received, a plurality of impedance elements connected to the manual controls in the plurality for providing variable impedances for varying the characteristics of the visual images in the different channels, and means including a channel selector control disposed at the front of the television receiver for providing access only to said group of manual controls for the selected channel to permit the ready adjustments of the characteristics of the visual image by said plurality of manual controls for the selected channel, the channel selector control being disposed in front of the manual controls in the plurality and being provided with a configuration to cover the manual controls and being provided with an opening to expose successive groups of the manual controls in the plurality upon a rotation of the channel selector control.

10. A control assembly for a television tuner in a television receiver having a plurality of channels, including, a plurality of manual controls disposed in groups for each channel for controlling the characteristics of the image visually presented by the television receiver for that channel, the manual controls in each group being disposed in axially aligned relationship and the manual controls in the different groups being disposed in annularly spaced relationship, a channel selector for selecting the channel to be received, means including a channel selector control mechanically coupled to the channel selector and disposed at the front of the television receiver in front of the manual controls in the plurality and provided with a configuration covering the manual controls and provided with an opening exposing successive groups of manual controls for manual operation upon a rotation of the channel selector control, a plurality of variable impedance elements each associated with a different manual control in the plurality to vary the characteristics of the visual image for the associated channel in accordance with the operation of the associated manual control, and switching means mechanically coupled to said channel selector control and electrically coupled to all of said variable impedance elements for establishing electrical connections to said impedance elements associated with said group of manual controls for the channel selected by said channel selector control.

11. A control assembly for a receiver television tuner in accordance with claim 10 wherein each of said variable impedance elements includes a printed circuit resistor having an arcuate shape, and a rotatable contact member for electrically contacting said resistor, said contact member being supported on the associated one of the manual controls.

12. A control assembly for a receiver television tuner, including, a plurality of manual controls for each channel for effecting different adjustments of the receiver tuner to determine the quality of the reception of the receiver tuner for that control, a channel selector for selecting the channel to be received, and means mechanically coupled to said selector for enabling the tuner adjustment by said plurality of manual controls associated with the channel selected by said channel selector, said plurality of manual controls for each channel forming a cylindrically shaped assembly and the assemblies for the different channels having different maximum diameters, and means for concentrically mounting the assemblies so that they form a tapered stack, said channel selector including a hollow control knob having a tapered stack of assemblies.

References Cited in the file of this patent

UNITED STATES PATENTS

| | | |
|---|---|---|
| 1,783,542 | Merle | Dec. 2, 1930 |
| 2,596,503 | Newnham | May 13, 1952 |
| 2,871,324 | Budd | Jan. 27, 1959 |
| 2,883,499 | Kilby et al. | Apr. 21, 1959 |
| 2,938,156 | Smith | May 24, 1960 |

FOREIGN PATENTS

| | | |
|---|---|---|
| 790,390 | Great Britain | Feb. 5, 1958 |